United States Patent
Isakanian et al.

(10) Patent No.: US 11,637,553 B2
(45) Date of Patent: Apr. 25, 2023

(54) CIRCUIT DEVICE AGING ASSESSMENT AND COMPENSATION

(71) Applicant: QUALCOMM Incorporated, San Diego, CA (US)

(72) Inventors: Patrick Isakanian, El Dorado Hills, CA (US); Satish Krishnamoorthy, San Diego, CA (US)

(73) Assignee: QUALCOMM INCORPOATED, San Diego, CA (US)

( * ) Notice: Subject to any disclaimer, the term of this patent is extended or adjusted under 35 U.S.C. 154(b) by 0 days.

(21) Appl. No.: 17/804,383

(22) Filed: May 27, 2022

(65) Prior Publication Data

US 2022/0393679 A1 Dec. 8, 2022

Related U.S. Application Data

(63) Continuation of application No. 17/339,195, filed on Jun. 4, 2021, now Pat. No. 11,381,238.

(51) Int. Cl.
*H03K 17/687* (2006.01)
*H03K 19/0185* (2006.01)
*H03K 5/24* (2006.01)
*G01R 31/28* (2006.01)

(52) U.S. Cl.
CPC ..... *H03K 17/6871* (2013.01); *G01R 31/2849* (2013.01); *H03K 5/24* (2013.01); *H03K 19/018507* (2013.01)

(58) Field of Classification Search
CPC ................. H03K 17/6871; H03K 5/24; H03K 19/018507; H03K 19/017581; G01R 31/2849

See application file for complete search history.

(56) References Cited

U.S. PATENT DOCUMENTS

| | | |
|---|---|---|
| 7,437,620 B2 | 10/2008 | Goodnow et al. |
| 8,081,003 B2 | 12/2011 | Pacha et al. |
| 8,111,085 B2 | 2/2012 | Ibaraki et al. |
| 9,472,246 B2 | 10/2016 | Priel et al. |
| 9,979,397 B1 | 5/2018 | Zhu et al. |
| 10,302,693 B2 | 5/2019 | Huard et al. |

(Continued)

OTHER PUBLICATIONS

International search report and written opinion—PCT/US2022/026804—ISA/EPO—dated Oct. 19, 2022 (Year: 2022).*

(Continued)

*Primary Examiner* — Jung Kim
(74) *Attorney, Agent, or Firm* — Loza & Loza, LLP

(57) ABSTRACT

An aspect relates to an apparatus including a set of one or more receivers; a first replica circuit being a substantial replica of at least a portion of one of the set of one or more receivers; a first control circuit generates an output signal selectively coupled to an input of the first replica circuit; a second replica circuit being a substantial replica of at least a portion of one of the set of one or more receivers; a comparator including a first input coupled to a first output of the first replica circuit, a second input coupled to a second output of the second replica circuit, and an output; and a second control circuit including an input coupled to the output of the comparator, and an output coupled to the first replica circuit and to the set of one or more receivers.

20 Claims, 8 Drawing Sheets

(56) References Cited

U.S. PATENT DOCUMENTS

| | | |
|---|---|---|
| 10,554,209 B2 | 2/2020 | Srivastava |
| 11,381,238 B1 | 7/2022 | Isakanian |
| 2005/0218945 A1 | 10/2005 | Kobayashi |
| 2011/0181315 A1* | 7/2011 | Krishnan ........... G01R 31/3016 |
| | | 324/762.01 |

OTHER PUBLICATIONS

Partial International Search Report—PCT/US2022/026804—ISA/EPO—dated Aug. 25, 2022.

* cited by examiner

CIRCUIT DEVICE AGING ASSESSMENT AND COMPENSATION

CROSS-REFERENCE TO RELATED APPLICATION

This application is a continuation of U.S. patent application Ser. No. 17/339,195, filed on Jun. 4, 2021, now issued as U.S. Pat. No. 11,381,238, which is incorporated herein by reference.

FIELD

Aspects of the present disclosure relate generally to integrated circuits (ICs) or discrete circuits, and in particular, to apparatus and methods for circuit device aging assessment and compensation.

BACKGROUND

The performance of a circuit device, such as a field effect transistor (FET), usually does not remain constant over its entire operational lifetime. For example, when a FET is operated over time by applying a varying gate-to-source voltage Vgs in accordance with the operation in which it is used, carriers are injected into the gate oxide of the FET, and get trapped in the oxide. The carriers trapped in the FET oxide typically increase the threshold Vth of the FET, requiring a larger Vgs drive voltage to achieve the same drain current through the FET. If such aging effects on FETs of an integrated circuit (IC) is not corrected, the operation of the IC may fall below specification or may even fail.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a set of one or more receivers; a first replica circuit being a substantial replica of at least a portion of one of the set of one or more receivers; a first control circuit generates an output signal selectively coupled to an input of the first replica circuit; a second replica circuit being a substantial replica of at least a portion of one of the set of one or more receivers; a comparator including a first input coupled to a first output of the first replica circuit, a second input coupled to a second output of the second replica circuit, and an output; and a second control circuit including an input coupled to the output of the comparator, and an output coupled to the first replica circuit and to the set of one or more receivers.

Another aspect of the disclosure relates to a method. The method includes providing one of a data signal and clock signal to a receiver; in an aging mode: providing an aging signal to a first replica circuit substantially simultaneously with the one of the data signal and clock signal being provided to the receiver, the first replica circuit being a substantial replica of the receiver, wherein the aging signal works the first replica circuit substantially the same or harder as the one of the data signal and clock signal works the receiver; and maintaining a second replica circuit disabled, the second replica circuit being a substantial replica of the receiver; in a calibration mode: enabling the second replica circuit; ceasing the providing of the aging signal to the first replica circuit; applying an input voltage to inputs of the first and second replica circuits, wherein the first and second replica circuits generate first and second output voltages based on the input voltage, respectively; generating a compensation voltage based on a difference between the first and second output voltages of the first and second replica circuits, respectively; and calibrating the receiver and the first replica circuit based on the compensation voltage.

Another aspect of the disclosure relates to an apparatus. The apparatus includes means for providing one of a data signal and clock signal to a receiver; in an aging mode: means for providing an aging signal to a first replica circuit substantially simultaneously with the one of the data signal and clock signal being provided to the receiver, the first replica circuit being a substantial replica of the receiver, wherein the aging signal works the first replica circuit substantially the same or harder as the one of the data signal and clock signal works the receiver; and means for maintaining a second replica circuit disabled, the second replica circuit being a substantial replica of the receiver; in a calibration mode: means for enabling the second replica circuit; means for ceasing the providing of the aging signal to the first replica circuit; means for applying an input voltage to inputs of the first and second replica circuits, wherein the first and second replica circuit generates first and second output voltages based on the input voltage, respectively; means for generating a compensation voltage based on a difference between the first and second output voltages of the first and second replica circuits, respectively; and means for calibrating the receiver and the first replica circuit based on the difference between the first and second output voltages.

Another aspect relates to an automotive control system. The automotive control system includes a set of automotive control signal transmitters; a set of automotive control signal receivers coupled to the set of automotive control signal transmitters via a set of transmission lines, respectively; and an aging compensation circuit. The aging compensation circuit includes a first replica circuit being a substantial replica of one of the set of automotive control signal receivers; a first control circuit including an output selectively coupled to an input of the first replica circuit; a second replica circuit being a substantial replica of one of the set of automotive control signal receivers; a comparator including a first input coupled to a first output of the first replica circuit, and a second input coupled to a second output of the second replica; and a second control circuit including an input coupled to an output of the comparator, and an output coupled to the first replica circuit and to the set of automotive control signal receivers.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

The disclosure relates to providing an aged replica circuit of a target circuit (e.g., a receiver) that is to be compensated for aging effects, and an unaged replica circuit of the target circuit. At the beginning of the operational life (startup) of the circuit, the aged replica circuit (not aged at this point) and the unaged replica circuit are calibrated to generate substantially the same output voltages. During the operational life of the circuit, the aged replica circuit is operated similar to the target circuit such that the aging of the aged replica circuit is substantially the same or more aggressive than the aging of the target circuit. The unaged replica circuit is disabled for most of the operational life of the circuit, and enabled periodically or in some time-based manner, to assess the aging of the aged replica circuit, and then compensate the aged replica circuit for aging effects followed by the target circuit.

Figure 1:
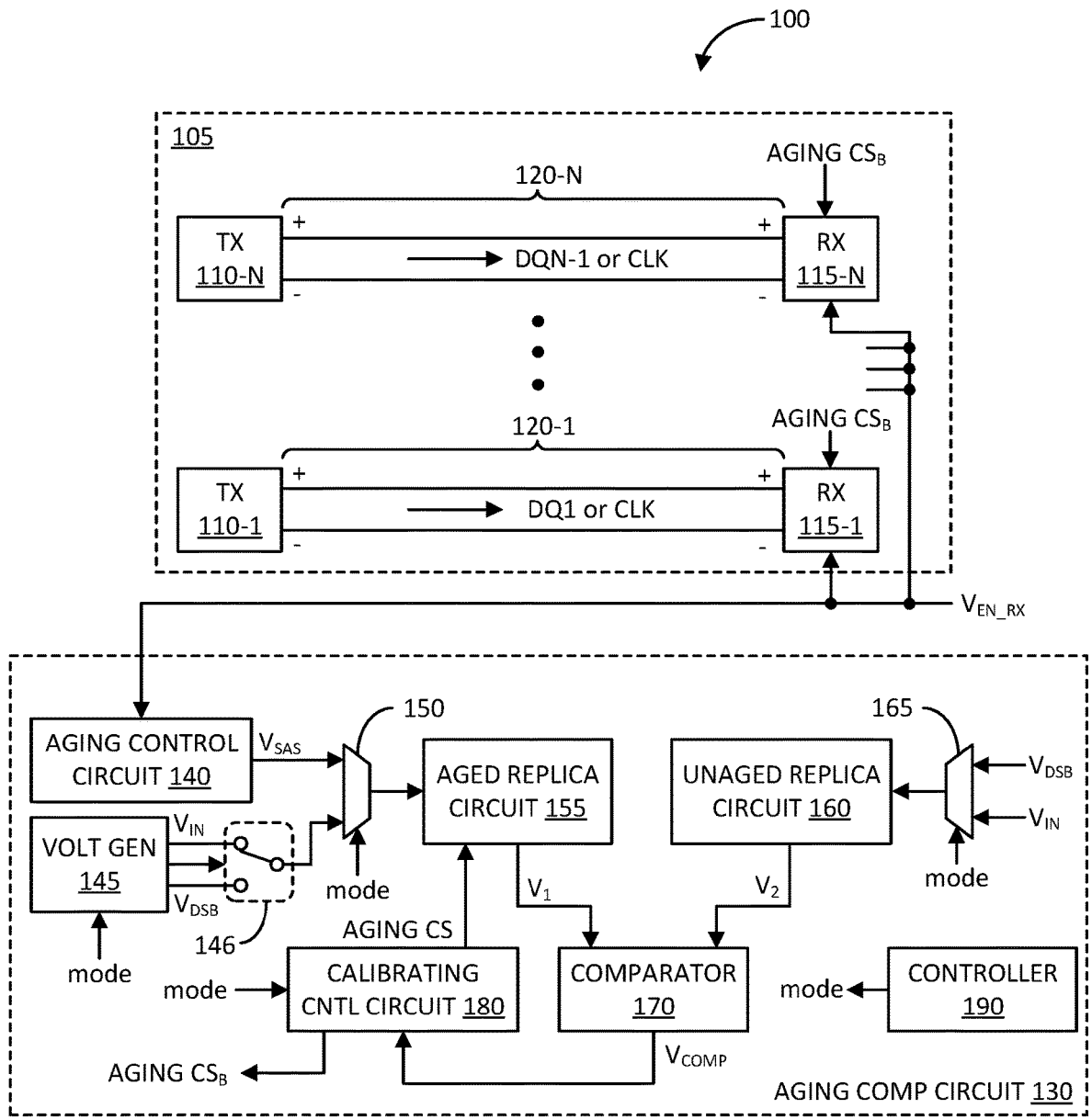
FIG. 1 illustrates a block diagram of an example apparatus including an example aging compensation circuit in accordance with an aspect of the disclosure.

FIG. 1 illustrates a block diagram of an example apparatus 100 including an example aging compensation circuit 130 in accordance with an aspect of the disclosure. The apparatus 100 includes a data transmission component 105, which may be, for example, a double data rate (DDR) memory data transmission component, or a Low Power DDR (LPDDR) memory data transmission component, etc. The data transmission component 105 includes a set of one or more transmitters (Tx) 110-1 to 110-N, a set of one or more receivers (Rx) 115-1 to 115-N, and a set of one or more transmission mediums 120-1 to 120-N coupling the set of one or more transmitters 110-1 to 110-N to the set of one or more receivers 115-1 to 115-N, respectively.

Each of these transmitters 110-1 to 110-N may be configured to transmit a data signal DQ or a clock (CLK) to a corresponding one of the receivers 115-1 to 115-N via a corresponding one of the transmission mediums 120-1 to 120-N. Typically, one of the transmitters (e.g., 110-N) is configured to transmit the clock (CLK), and the remaining transmitters (e.g., 110-1 to 110-N−1) are configured to transmit data signals DQ1 to DQN−1, respectively. As illustrated, the set of transmitters 110-1 to 110-N are configured to transmit data signals DQ1 to DQN−1 and clock (CLK) to the set of receivers 115-1 to 115-N via the set of transmission mediums 120-1 to 120-N. Each transmission medium may be configured as one or more metallization lines or traces on a printed circuit board (PCB), such as, for example, a differential transmission line pair per each transmitter-receiver pair.

The aging compensation circuit 130 includes an aging control circuit 140, a voltage generator 145, a first multiplexer 150, an aged replica circuit 155, an unaged replica circuit 160 (e.g., which may be referred to as a "golden reference"), a second multiplexer 165, a comparator 170, and a calibrating control circuit 180. The aging compensation circuit 130 may further include a controller 190 configured to generate a mode signal to control the mode of operation of the aging compensation circuit 130. As discussed in more detail herein, the mode of operations may include a startup mode, an aging mode, and a calibration mode.

The aging control circuit 140 is configured to generate a simulated aging signal or voltage $V_{SAS}$ to operate or work the aged replica circuit 155 substantially the same or harder (e.g., at a higher rate) as the data signal DQ1 or clock signal (CLK) operate or work a target circuit, such as any one of the receivers 115-1 to 115-N. In this example, a receiver enable signal $V_{EN\_RX}$ is coupled to the set of receivers 115-1 to 115-N, and to the aging control circuit 140. When the receiver enable signal $V_{EN\_RX}$ is asserted, the set of receivers 115-1 to 115-N receive data signals DQ1 to DQN−1 and clock signal from the set of transmitters 110-1 to 110-N via the set of transmission mediums 120-1 to 120-N. When the receiver enable signal $V_{EN\_RX}$ is not asserted, no data or clock signal are being transmitted between the transmitters 110-1 to 110-N and the receivers 115-1 to 115-N.

Similarly, when the receiver enable signal $V_{EN\_RX}$ is asserted, the aging control circuit 140 operates to generate the simulated aging signal or voltage $V_{SAS}$ to operate or work the aged replica circuit 155 substantially the same or harder as the data signals DQ1 to DQN−1 and clock signal (CLK) operate or work the set of receivers 115-1 to 115-N. When the receiver enable signal $V_{EN\_RX}$ is not asserted, the aging control circuit 140 may be disabled (e.g., not generate $V_{SAS}$) in order to conserve power.

The aging control circuit 140 includes an output coupled to a first input of the multiplexer 150. The voltage generator 145 includes at least one output coupled to a second input of the multiplexer 150 via an associated or integrated single pole double throw (SPDT) switch 146. The multiplexer 150 includes a select input configured to receive the mode signal generated by the controller 190. The multiplexer 150 includes an output coupled to a first input of the aged replica circuit 155. As an example, if the mode signal indicates the aging mode, the multiplexer 150 passes the simulated aging signal or voltage $V_{SAS}$ to the first input of the aged replica circuit 155. If the mode signal indicates the startup or calibration mode, the multiplexer 150 passes a voltage $V_{IN}$ received from the voltage generator 145 via the SPDT 146 to the first input of the aged replica circuit 155. As an example, the voltage $V_{IN}$ may be a common mode voltage $V_{CM}$ in the case that the aged replica circuit 155 (as well as the set of receivers 115-1 to 115-N) are configured as differential circuits.

There may optionally be a mode of operation to disable the aged replica circuit 155 in order to conserve power; in such case, the voltage generator 145 may be configured to generate a disabling voltage $V_{DSB}$. In such mode, the multiplexer 150 receives the disabling voltage $V_{DSB}$ from the voltage generator 145 via the SPDT 146, and passes the disabling voltage $V_{DSB}$ to the first input of the aged replica circuit 155, which effectively disables the aged replica circuit 155. It shall be understood that the voltage generator 145 may generate other voltages including a lower voltage rail potential Vss, which may be ground potential for other modes of operations or applications.

The aged replica circuit 155 may be a substantial replica of at least a portion of one of the set of receivers 115-1 to 115-N. For example, each of the set of receivers 115-1 to 115-N may include a pre-amplifier stage, an equalizer, a clock and data recovery (CDR) circuit, a deserializer, etc. The aged replica circuit 155 may be a substantial replica of the pre-amplifier stage, and not the other components of the receiver. Further, the aged replica circuit 155 need not be an exact replica of the front amplification stage, but may include more component(s) or less component(s), which does not substantially affect the similar aging effects between the receivers 115-1 to 115-N and the aged replica circuit 155. Alternatively, or in addition to, the aged replica circuit 155 may be a smaller scale version of at least a portion of one of the set of receivers 115-1 to 115-N (e.g., using 10× (or other ratio) smaller size transistors). As illustrated, the aged replica circuit 155 includes a second input to receive an aging control signal (AGING CS) and an output configured to produce a first output voltage $V_1$ (e.g., a direct current (DC) voltage).

The second multiplexer 165 includes first and second inputs, which may also be coupled to the voltage generator 145. For example, the first input of the second multiplexer 165 may be configured to receive the disabling signal $V_{DSB}$ from the voltage generator 145. Similarly, the second input of the second multiplexer 165 may be configured to receive the voltage $V_{IN}$ from the voltage generator 145. The second multiplexer 165 additionally includes a select input configured to receive the mode signal generated by the controller 190. Further, the second multiplexer 165 includes an output coupled to the unaged replica circuit 160.

Similar to the aged replica circuit 155, the unaged replica circuit 160 may be a substantial replica of at least a portion of one of the set of receivers 115-1 to 115-N. For example, the unaged replica circuit 160 may be a substantial replica of the front amplification stage of one of the receivers 115-1 to 115-N, and not the other components (e.g., equalizer, CDR, deserializer, etc.) of the receiver. Further, the unaged replica circuit 160 also need not be an exact replica of the front amplification stage, but may include more component(s) or less component(s). As discussed, the unaged replica circuit 160 may be a smaller scale version of at least a portion of one of the set of receivers 115-1 to 115-N (e.g., using 10× (or other ratio) smaller size transistors). For instance, the unaged replica circuit 160 may be a substantial replica of the aged replica circuit 155. As illustrated, the unaged replica circuit 160 includes an output configured to produce a second output voltage $V_2$ (e.g., a DC voltage).

The comparator 170 includes first and second inputs coupled to the outputs of the aged replica circuit 155 and the unaged replica circuit 160, respectively. Accordingly, the comparator 170 is configured to receive the first and second output voltages $V_1$ and $V_2$ at its first and second inputs, respectively. The comparator 170 includes an output configured to generate a compensation voltage $V_{COMP}$ based on a difference between the first and second output voltages $V_1$ and $V_2$.

The calibrating control circuit 180 includes a first input coupled to the output of the comparator 170. As such, the first input of the calibrating control circuit 180 is configured to receive the compensation voltage $V_{COMP}$. The calibrating control circuit 180 includes a second input configured to receive the mode signal generated by the controller 190, and a first output configured to generate the aging control signal (AGING CS). The first output of the calibrating control circuit 180 is coupled to a second input of the aged replica circuit 155. The calibrating control circuit 180 further includes a second output configured to generate a broadcast aging control signal (AGING $CS_B$). The second output is coupled to inputs of the set of receivers 115-1 to 115-N, respectively.

Upon startup, the set of receivers 115-1 to 115-N, aged replica circuit 155, and unaged replica circuit 160 are not aged or may have negligible aging due to testing or other preliminary operations. During startup, the aged replica circuit 155 is calibrated to generate the first output voltage $V_1$ to be substantially equal to the second output voltage $V_2$ generated by the unaged replica circuit 160.

In this regard, the controller 190 sets the mode of operation as startup mode. In such mode, the first and second multiplexers 150 and 165 pass the voltage $V_{IN}$ to the inputs of the aged and unaged replica circuits 155 and 160, respectively. In response, the aged and unaged replica circuits 155 and 160 generate the first and second output voltages $V_1$ and $V_2$ based on the input voltage $V_{IN}$. The comparator 170 generates the compensation voltage $V_{COMP}$ based on a difference between the first and second output voltages $V_1$ and $V_2$. The calibrating control circuit 180 generates the aging control signal (AGING CS) based on the compensation voltage $V_{COMP}$ to adjust the aged replica circuit 155 such that it outputs the first output voltage $V_1$ substantially equal to the second output voltage $V_2$ (e.g., $V_{COMP}$=0 Volt (V)). As both the aged replica circuit 155 and the unaged replica circuit 160 are substantially unaged at startup, the equalization of the first and second output voltages $V_1$ and $V_2$ indicates that these circuits are at the same aging level.

After the startup mode, the aging compensation circuit 130 operates in aging mode. In such mode, the first and second multiplexers 150 and 165 pass the voltages $V_{SAS}$ and $V_{DSB}$ to the inputs of the aged and unaged replica circuits 155 and 160, respectively. The disabling voltage $V_{DSB}$ being passed to the unaged replica circuit 160 effectively disables the unaged replica circuit 160. This is done so that the unaged replica circuit 160 does not age while in aging mode to maintain the aging of the unaged replica circuit 160 to a minimum or very low. The simulated aging signal or voltage $V_{SAS}$ being passed to the aged replica circuit 155 works or operates the aged replica circuit 155 in substantially the same manner or harder as the data signals DQ1 to DQN−1 and clock signal (CLK) work or operate the corresponding set of receivers 115-1 to 115-N. Thus, when the receiver enable signal $V_{EN\_RX}$ is asserted, the receivers 115-1 to 115-N are being worked or operated by the signals they receive; and in response to the asserted enable signal $V_{EN\_RX}$, the aging control circuit 140 works or operates the aged replica circuit 155 via the simulated aging signal $V_{SAS}$.

Periodically or in some time-based manner, the aging compensation circuit 130 operates in calibration mode, e.g., the mode signal generated by the controller 190 indicates calibration mode. In calibration mode, the aged replica circuit 155 is assessed for aging effects based on changes in the first output voltage $V_1$. For example, for a particular implementation of the aged replica circuit 155, the first output voltage $V_1$ has a tendency to decrease with aging. The comparator 170 then generates the compensation voltage $V_{COMP}$, which is based on a difference between the first output voltage $V_1$ and the second output voltage $V_2$, indicating the aging of the aged replica circuit 155. The calibrating control circuit 180 then generates or adjusts the aging control signal (AGING CS) to cause the first output voltage $V_1$ to be substantially the same as the second output voltage $V_2$. Thus, at this point the aged replica circuit 155 has been compensated for aging. The final aging control signal (AGING CS) per this calibration cycle is then broadcasted (AGING $CS_B$) to the set of receivers 115-1 to 115-N in order to compensate the receivers for aging.

In more detail, in calibration mode, the first and second multiplexers 150 and 165 pass the voltage $V_{IN}$ to the inputs of the aged and unaged replica circuits 155 and 160, respectively. Thus, in calibration mode, the aging control circuit 140 is decoupled from the aged replica circuit 155, which, as a consequence, the aged replica circuit 155 ceases to receive the simulated aging signal $V_{SAS}$. Further, in calibration mode, the disabling voltage $V_{DSB}$ is not coupled to the unaged replica circuit 160; instead, $V_{IN}$ is applied to the unaged replica circuit 160. In response to receiving the input voltage $V_{IN}$, the aged and unaged replica circuits 155 and 160 generate the first and second output voltages $V_1$ and $V_2$ based on the input voltage $V_{IN}$. The comparator 170 generates the compensation voltage $V_{COMP}$ based on a difference between the first and second output voltages $V_1$ and $V_2$. The calibrating control circuit 180 adjusts the aging control signal (AGING CS) to cause the aged replica circuit 155 to generate the first output voltage $V_1$ such that it is substantially equal to the second output voltage $V_2$. In response to $V_1$ and $V_2$ being substantially equal, the calibrating control circuit 180 broadcasts the final aging signal (AGING $CS_B$) per this calibration cycle to the set of receivers 115-1 to 115-N in order to compensate the receivers for aging.

The frequency of the calibration cycles may be based on metrics or functions related to the use of the data transmission component 105. If the use of the data transmission component 105 is relatively high, then the frequency of the calibration cycles should also be relatively high. Conversely, if the use of the data transmission component 105 is relatively low, then the frequency of the calibration cycles should also be relatively low. As an example, if the apparatus 100 is used in automotive applications, the use of the data transmission component 105 may be high compared to the use of the data transmission component 105 if it is used in cellular phone applications. As the unaged replica circuit 160 is enabled during a calibration cycle, the frequency of the calibration cycles should be kept low enough so as not to significantly age the unaged replica circuit 160.

Figure 2:
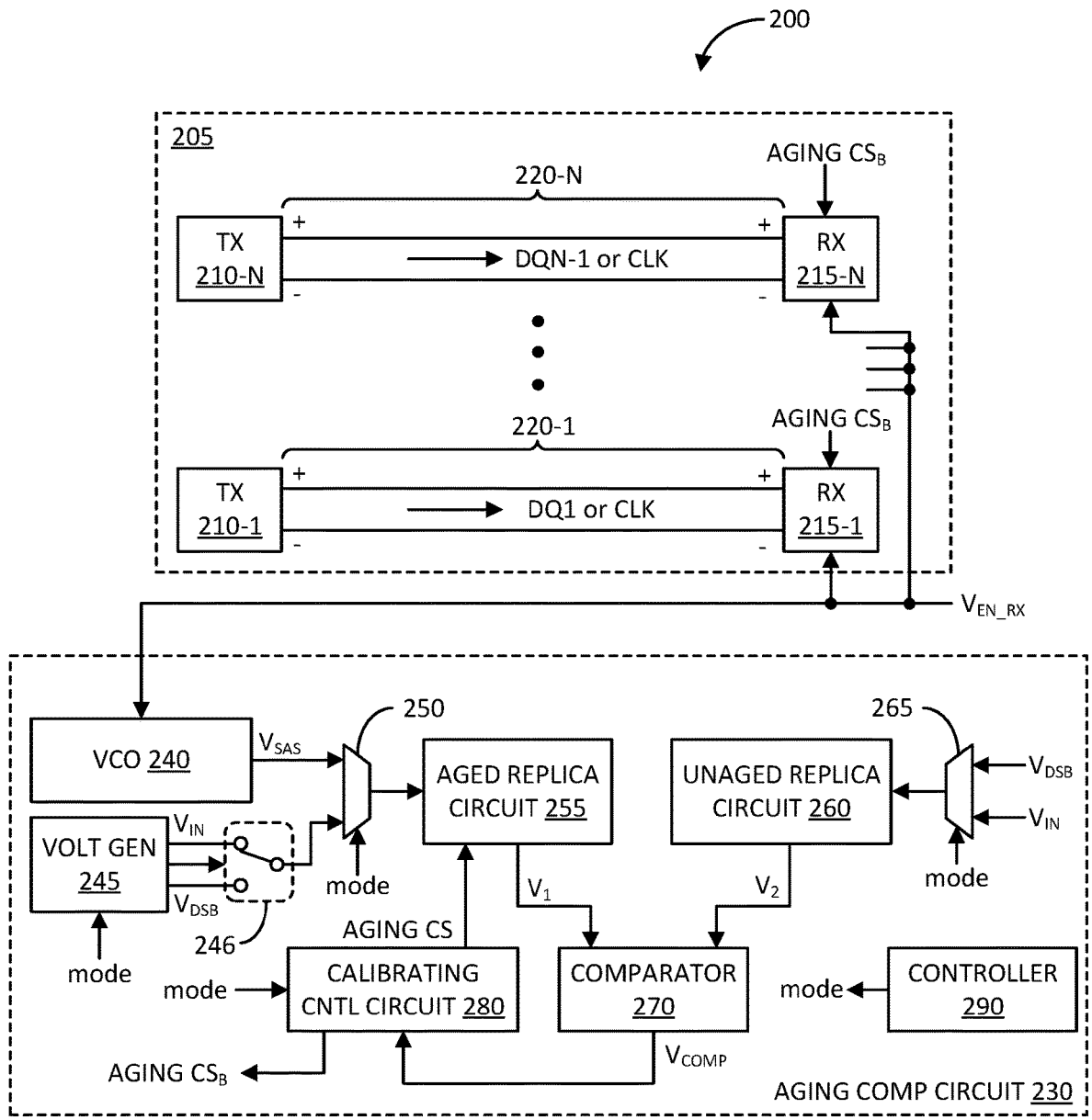
FIG. 2 illustrates a block diagram of another example apparatus including another example aging compensation circuit in accordance with another aspect of the disclosure.

FIG. 2 illustrates a block diagram of another example apparatus 200 including another example aging compensation circuit 230 in accordance with another aspect of the disclosure. The apparatus 200 is an example of a more specific implementation of the apparatus 100 in that the aging control circuit 140 of apparatus 100 may be configured as an oscillator, such as a voltage-controlled oscillator (VCO). The elements of the apparatus 200 that are the same or common with the apparatus 100 are designated with the same reference numbers with the exception that their most significant digit (MSD) is a "2" instead of a "1". The details of these common elements have been discussed with reference to apparatus 100.

As mentioned, the aging control circuit 140 of apparatus 100 may be implemented as an oscillator or VCO 240 in apparatus 200. Accordingly, the VCO 240 is configured to generate a simulated aging signal or voltage $V_{SAS}$ as an oscillating signal, which may also be substantially periodic. The frequency of the oscillating signal $V_{SAS}$ may be consistent with the data rate of the data signals DQ1 to DQN-1 or frequency of the clock signal (CLK) provided to the set of receivers 215-1 to 215-N. For example, the frequency of the oscillating signal $V_{SAS}$ may be within an expected or specified range for the data rates the data signals DQ1 to DQN-1 or frequency of the clock signal (CLK). According to another example, the frequency of the oscillating signal $V_{SAS}$ may be on the high side or higher than the expected or specified range for the data rates the data signals DQ1 to DQN-1 or frequency of the clock signal (CLK). This may be because it may be more beneficial to assess the aging of the set of receivers 215-1 to 215-N higher than the actual aging of the receivers.

Thus, in aging mode, when the receiver enable signal $V_{EN\_RX}$ is asserted (indicating that the receivers 215-1 to 215-N are receiving the data signals DQ1 to DQN-1 and the clock signal (CLK)), the VCO 240 generates the oscillating aging signal $V_{SAS}$, which is passed to the aged replica circuit 255 by the multiplexer 250. Thus, the oscillating aging signal $V_{SAS}$ works or operates the aged replica circuit 255 substantially the same or harder as the data signals DQ1 to DQN-1 and the clock signal (CLK) work or operate the set of receivers 215-1 to 215-N. When the receiver enable signal $V_{EN\_RX}$ is not asserted (indicating that the receivers 215-1 to 215-N are not receiving the data signals DQ1 to DQN-1 and the clock signal (CLK)), the VCO 240 is disabled by a de-asserted receiver enable signal $V_{EN\_RX}$.

Figure 3:
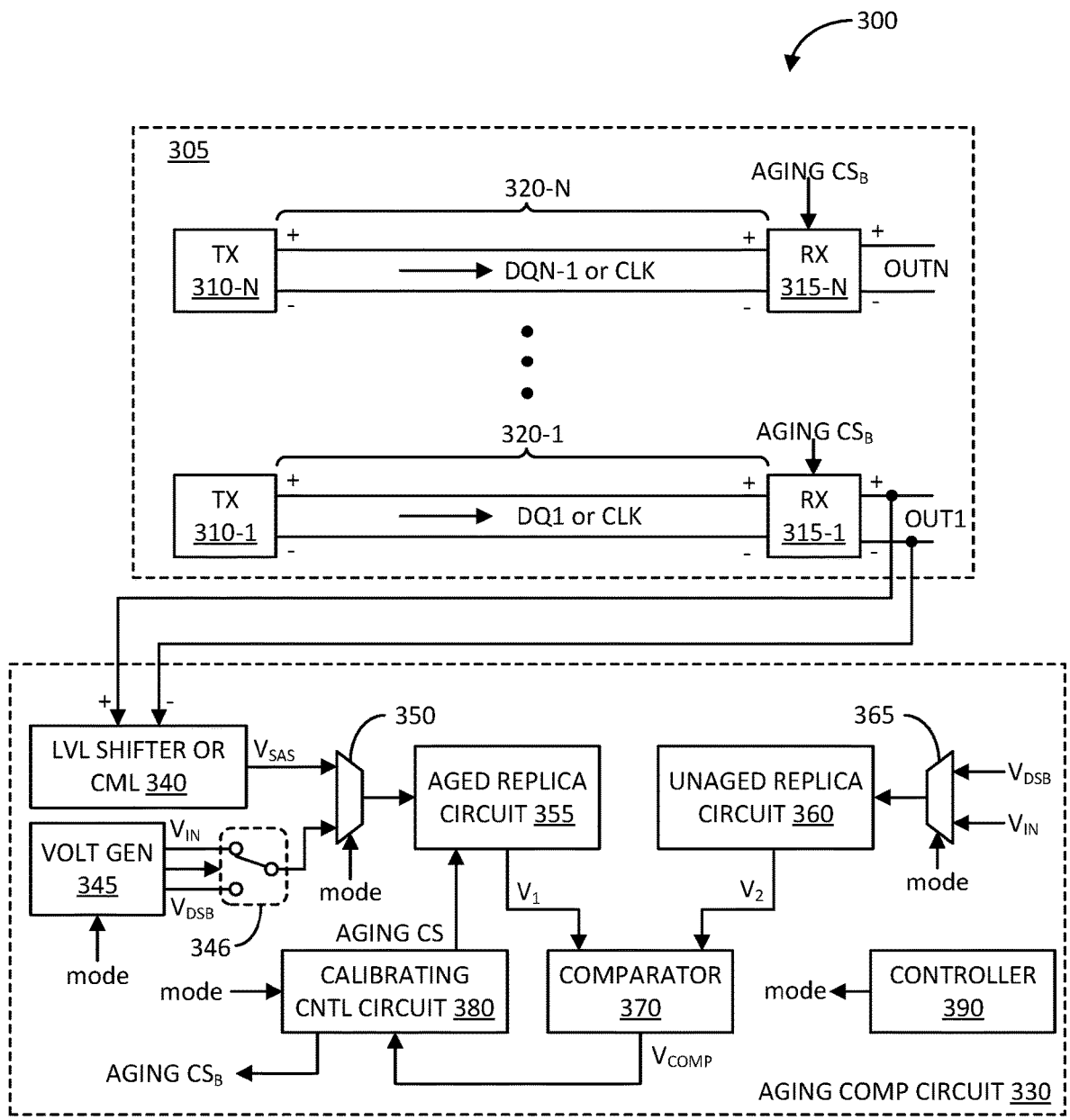
FIG. 3 illustrates a block diagram of yet another example apparatus including yet another example aging compensation circuit in accordance with another aspect of the disclosure.

FIG. 3 illustrates a block diagram of another example apparatus 300 including another example aging compensation circuit 330 in accordance with another aspect of the disclosure. Similarly, the apparatus 300 is an example of a more specific implementation of the apparatus 100 in that the aging control circuit 140 of apparatus 100 may be coupled to an output of one of the set of receivers such that the simulated aging signal $V_{SAS}$ is based on the data signal or clock signal received by such receiver. The elements of apparatus 300 that are the same or common with the apparatus 100 are designated with the same reference numbers with the exception that their MSD is a "3" instead of a "1". The details of these common elements have been discussed with reference to apparatus 100.

In apparatus 300, the aging control circuit 340 may be implemented as a voltage level shifter or current-mode logic (CML) circuit. In this example, the voltage level shifter or CML circuit 340 is differential, but could be single ended as well. The voltage level shifter or CML circuit 340 includes a differential input coupled to a differential output of one of the set of receivers, such as receiver 315-1. As previously mentioned, the differential input of the voltage level shifter or CML circuit 340 may be coupled to the differential output of the first amplification stage of the receiver 315-1, as the receiver 315-1 may include additional stages, such as an equalizer, CDR, deserializer, etc. The voltage level shifter or CML circuit 340 then receives the differential data signal DQ1 or clock signal (CLK) from the differential output (OUT-1) of the receiver 315-1, and voltage level shifts the differential signal to generate the simulated aging signal or voltage $V_{SAS}$ at a voltage level suitable for the input of the aged replica circuit 355. As the simulated aging signal $V_{SAS}$ is based on the data signal DQ1 or clock signal (CLK), it may work or operate the aged replica circuit 355 substantially the same as the data signal DQ1 or clock signal (CLK) work or operate the receiver 315-1.

Thus, in aging mode, the voltage level shifter or CML 340 generates the simulated aging signal $V_{SAS}$ when the receiver 315-1 receives the data signal DQ1 or clock signal (CLK). The simulated aging signal $V_{SAS}$ is passed to the aged replica circuit 355 by the multiplexer 350. Thus, the simulated aging signal $V_{SAS}$ works or operates the aged replica circuit 355 substantially the same as the data signal DQ1 or the clock signal (CLK) work or operate the receiver 315-1. When the receiver 315-1 is not receiving the data signal DQ1 or the clock signal (CLK), the voltage level shifter or CML 340 is effectively disabled as it is not generating the simulated aging signal $V_{SAS}$.

Figure 4:
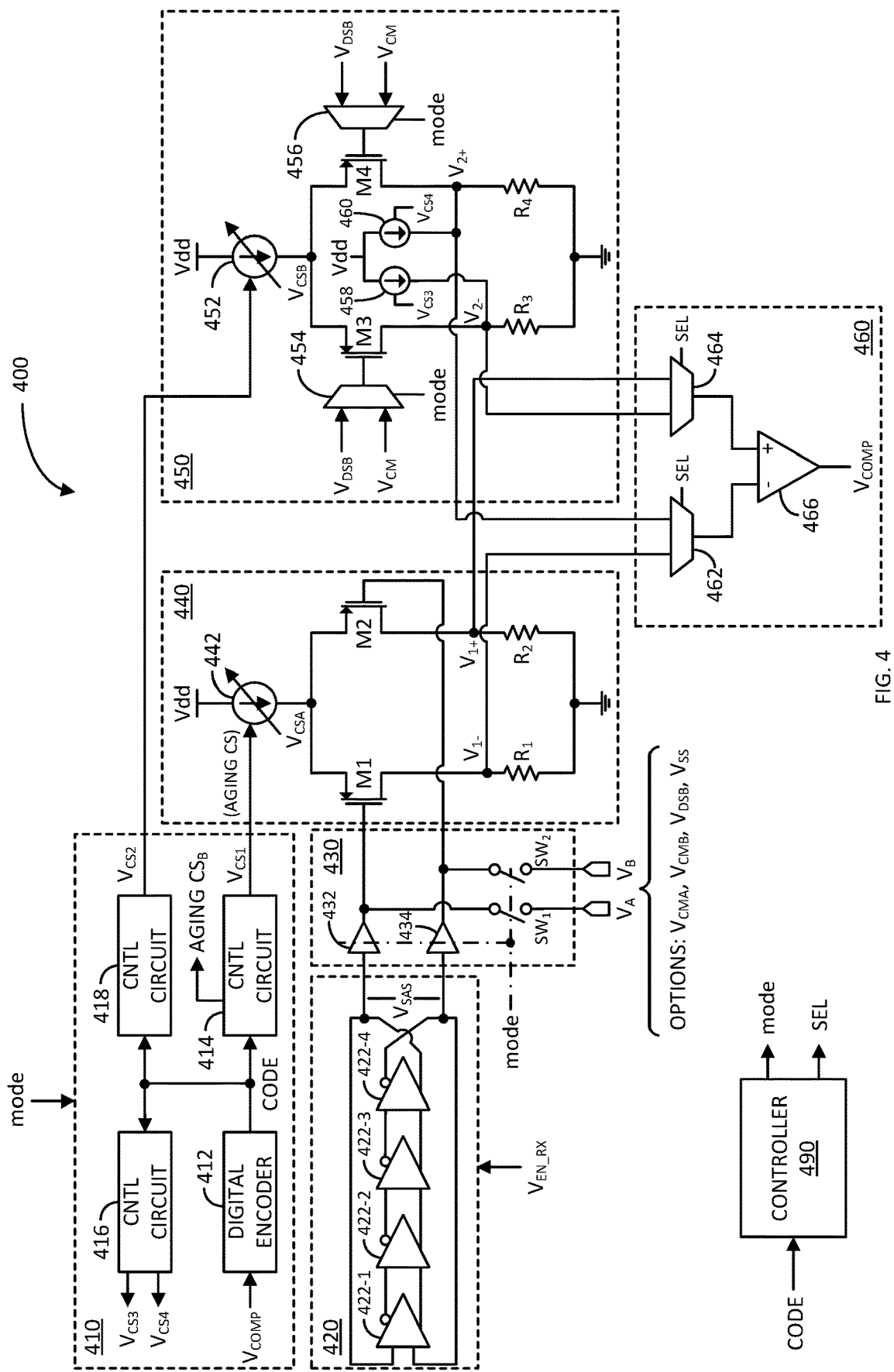
FIG. 4 illustrates a schematic diagram of an example aging compensation circuit in accordance with another aspect of the disclosure.

FIG. 4 illustrates a schematic diagram of an example aging compensation circuit 400 in accordance with another aspect of the disclosure. The aging compensation circuit 400 may be an example of a more detailed implementation of the aging compensation circuit 230 previously discussed.

In particular, the aging compensation circuit 400 includes a calibration control circuit 410, a voltage-controlled oscillator (VCO) 420, a first multiplexer 430, an aged replica circuit 440, an unaged replica circuit 450, a comparator 460, and a controller 490. Beginning with the VCO 420, it includes a set of cascaded differential buffers or inverters 422-1 to 422-4. In this example, the VCO 420 includes four (4) buffers or inverters 422-1 to 422-4. However, it shall be understood that the VCO 420 may include a different number of cascaded differential buffers or inverters. For feedback oscillation purposes, the last buffer or inverter 422-4 includes complementary outputs cross-coupled to complementary inputs of the first buffer or inverter 422-1. As previously discussed, the VCO 420 is configured to receive the receiver enable signal $V_{EN\_RX}$ to enable the VCO 420 to generate a differential simulated aging signal or voltage $V_{SAS}$ when the set of receivers 215-1 to 215-N are enabled to receive the data signals DQ1 to DQN−1 and the clock signal (CLK); and disabled otherwise, as previously discussed.

The first multiplexer 430 includes a pair of tristate buffers 432 and 434 and a pair of switching devices $SW_1$ to $SW_2$ (which may be configured as field effect transistors (FETs)). The tristate buffers 432 and 434 include inputs coupled to the differential output of the last buffer or inverter 422-4 (also the differential input of the first buffer or inverter 422-1) of the VCO 420. The switching devices $SW_1$ and $SW_2$ are coupled between outputs of a voltage generator (e.g., voltage generator 245) and outputs of the tristate buffers 432 and 434, respectively. For flexibility, the voltage generator may apply independent or the same voltages to the switching devices $SW_1$ and $SW_2$, such as different common mode voltages $V_{CMA}$ and $V_{CMB}$, a disabling voltage $V_{DSB}$, which may be at Vdd potential or $V_{CSA}$ potential at the sources of FETs M1 and M2, or Vss or ground.

The tristate buffers 432 and 434 and switching devices $SW_1$ and $SW_2$ include control inputs configured to receive the mode signal generated by the controller 490. For example, if the mode signal indicates either startup or calibration mode, the tristate buffers 432 and 434 are tristated and the switching devices $SW_1$ and $SW_2$ are in their closed states. If the mode signal indicates aging mode, the tristate buffers 432 and 434 pass the differential simulated aging signal $V_{SAS}$ to the aged replica circuit 440, and the switching devices $SW_1$ and $SW_2$ are in their open states.

As discussed, the aged replica circuit 440 may be a substantial replica of at least a portion of any of the receivers 215-1 to 215-N, such as, for example, a front-end differential amplification stage of each receiver. As an example, the aged replica circuit 440 includes a variable current source 442, input differential FET pair M1 and M2 (e.g., each implemented as a p-channel metal oxide semiconductor FET (PMOS FET)), and a pair of output resistors $R_1$ and $R_2$. On a negative side of the differential implementation, the current source 442, FET M1, and resistor $R_1$ are coupled in series between an upper voltage rail Vdd and a lower voltage rail Vss (e.g., ground). On a positive side of the differential implementation, the current source 442, FET M2, and resistor $R_2$ are coupled in series between the upper voltage rail Vdd and the lower voltage rail Vss (e.g., ground). The FETs M1 and M2 include gates coupled to the outputs of the tristate buffers 432 and 434, respectively.

Also, as discussed, the unaged replica circuit 450 may be a substantial replica of at least a portion of any of the receivers 215-1 to 215-N, such as, for example, a front-end differential amplification stage of each receiver. For example, the unaged replica circuit 450 includes a variable current source 452, input differential FET pair M3 and M4 (e.g., each implemented as a PMOS FET), and a pair of output resistors $R_3$ and $R_4$. On a negative side of the differential implementation, the current source 452, FET M3, and resistor $R_3$ are coupled in series between the upper voltage rail Vdd and the lower voltage rail Vss (e.g., ground). On a positive side of the differential implementation, the current source 452, FET M4, and resistor $R_4$ are coupled in series between the upper voltage rail Vdd and the lower voltage rail Vss (e.g., ground). The FETs M3 and M4 include gates coupled to the outputs of multiplexers 454 and 456, respectively.

With reference to aging compensation circuit 230, the multiplexers 454 and 456 may correspond to multiplexer 265 (and, in this example, the multiplexers 454 and 456 are illustrated as part of the unaged replica circuit 450). The multiplexers 454 and 456 are on the negative and positive sides of the differential implementation, respectively, and include respective first inputs configured to receive a disabling voltage $V_{DSB}$, and respective second inputs configured to receive a common mode voltage $V_{CM}$. As previously discussed, the disabling voltage $V_{DSB}$ disables the unaged replica circuit 450 by turning off the FETs M3 and M4 when it is applied to their gates. As the FETs M3 and M4 are PMOS FETs, the disabling voltage $V_{DSB}$ may be at Vdd potential or $V_{CSB}$ potential at the sources of FETs M3 and M4 (so that the gate-to-source voltage $V_{GS}$ is substantially zero or less than the threshold voltage of the FETs M3 and M4). Alternatively, switching devices may be implemented to short the gate and source together of the FETs M3 and M4 when the unaged replica circuit 450 is to be disabled. The multiplexers 454 and 456 include select inputs configured to receive the mode signal from the controller 490.

For fine resolution offset cancellation during startup mode as discussed further herein, the unaged replica circuit 450 includes a first variable current source 458 coupled between the upper voltage rail Vdd and a node between the drain of PMOS FET M3 and the output resistor $R_3$ (e.g., the negative output) of the unaged replica circuit 450. Additionally, the unaged replica circuit 450 includes a second variable current source 452 coupled between the upper voltage rail Vdd and a node between the drain of PMOS FET M4 and the output resistor $R_4$ (e.g., the positive output) of the unaged replica circuit 450.

The comparator 460 includes a first multiplexer 462, a second multiplexer 464, and a differential amplifier 466. The first multiplexer 462 includes a first input coupled the negative output of the aged replica circuit 440. The first multiplexer 462 includes a second input coupled to the positive output of the unaged replica circuit 450. The second multiplexer 464 includes a first input coupled to the negative output of the unaged replica circuit 450. The second multiplexer 464 includes a second input coupled to positive output of the aged replica circuit 440. The first and second multiplexers 462 and 464 include select inputs configured to receive a select signal SEL generated by controller 490.

The differential amplifier 466 includes a first input (e.g., negative input) coupled to an output of the first multiplexer 462, a second input (e.g., positive input) coupled to an output of the second multiplexer 464, and an output configured to generate a compensation voltage $V_{COMP}$. As discussed further herein, the compensation voltage $V_{COMP}$ may be based on a difference between: (1) the negative output voltage $V_{2-}$ of the unaged replica circuit 450 and the negative output voltage $V_{1-}$ of the aged replica circuit 440 if the select signal SEL selects the respective first inputs of the multiplexers 462 and 464 (e.g., SEL-0; $V_{COMP}=V_{2-}-V_{1-}$); or (2) the positive output voltage $V_{1+}$ of the aged replica circuit 440 and the positive output voltage $V_{2+}$ of the unaged replica circuit 450 if the select signal SEL selects the respective second inputs of the multiplexers 462 and 464 (e.g., SEL=1; $V_{COMP}=V_{1+}-V_{2+}$). In both cases, the compensation voltage $V_{COMP}$ provides an indication of the aging of the aged replica circuit 440; and by extension, the aging of the set of receivers 215-1 to 215-N.

The calibration control circuit 410 includes a digital encoder 412, a first control circuit 414, a second control circuit 418, and a third control circuit 416. The digital encoder 412 may be implemented as a thermometer encoder or analog-to-digital converter (ADC). The digital encoder 412 includes an input coupled to an output of the comparator 460, and configured to receive therefrom the compensation voltage $V_{COMP}$. The digital encoder 412 is configured to generate a digital code based on the compensation voltage $V_{COMP}$. The digital encoder 412 includes an output, at which the digital code is produced, coupled to inputs of the first, second, and third control circuits 414, 418, and 416, and an input of the controller 490.

As discussed in more detail further herein, the first control circuit 414 is configured to generate a first current source control signal or voltage $V_{CS1}$ based on the code. The first current source control signal or voltage $V_{CS1}$ is an example of the aging control signal AGING CS previously discussed. The first control circuit 414 is also configured to generate the broadcasted aging control signal (AGING $CS_B$) for the set of receivers 215-1 to 215-N. Accordingly, the first control circuit 414 includes a first output, at which the control voltage $V_{CS1}$ is produced, coupled to a control input of the variable current source 442 of the aged replica circuit 440. The first control circuit 414 includes a second output, at which the broadcast control signal AGING $CS_B$ is produced, coupled to control inputs of corresponding variable current sources of the set of receivers 215-1 to 215-N, respectively.

The second control circuit 418 is configured to generate a second current source control signal or voltage $V_{CS2}$ based on the code. The second control circuit 418 includes an output, at which the control voltage $V_{CS2}$ is produced, coupled to a control input of the variable current source 452 of the unaged replica circuit 450. The third control circuit 416 is configured to generate current control signals or voltages $V_{CS3}$ and $V_{CS4}$ based on the code. The third control circuit 416 includes outputs, at which the control voltages $V_{CS3}$ and $V_{CS4}$ are respectively produced, coupled to control inputs of current sources 458 and 460 of the unaged replica circuit 450.

The operation of the aging compensation circuit 400 may be as follows: During startup, the aged replica circuit 440 and the unaged replica circuit 450 are effectively unaged or at substantially the same aging level. Accordingly, the compensation voltage $V_{COMP}$ should be 0V to indicate that the aged replica circuit 440 and the unaged replica circuit 450 are at substantially the same aging level. But, due to process variation, the compensation voltage $V_{COMP}$ may not be at 0V. Thus, during startup, the aged replica circuit 440 and unaged replica circuit 450 are calibrated such that the compensation voltage $V_{COMP}$ based on $V_{2-}-V_{1-}$ and/or $V_{1+}-V_{2+}$ are equal to substantially 0V.

For example, the controller 490 sets the mode signal to startup mode. In response to the startup mode signal, the tristate buffers 432 and 434 are tristated, and the switching devices $SW_1$ and $SW_2$ are in the closed state. The voltage regulator 245 may provide a common mode voltage $V_{CMA}$ to the gates of the PMOS FETs M1 and M2 via the closed switching devices $SW_1$ and $SW_2$, respectively. The voltage regulator 245 may also provide the common mode voltage $V_{CMA}$ to the second inputs of the multiplexers 454 and 456 of the unaged replica circuit 450. The multiplexers 454 and 456, in response to the mode signal indicating the startup mode, passes the common mode voltage $V_{CMA}$ to the gates of the PMOS FETs M3 and M4, respectively.

The controller 490 may first select $V_{2-}-V_{1-}$ via select signal SEL=0 to calibrate the aged replica circuit 440 and the unaged replica circuit 450. Initially, the compensation voltage $V_{COMP}$ may not be at 0V, which means the aged replica circuit 440 and the unaged replica circuit 450 are yet to be calibrated. The digital encoder 412 generates the code based on the compensation voltage $V_{COMP}$. The control circuits 414, 418, and 416 adjusts the current control voltages $V_{CS1}$, $V_{CS2}$, and $V_{CS3}$ to adjust the currents generated by the current sources 442, 452, and 458 until the code indicates that the compensation voltage $V_{COMP}$ is substantially at 0V, respectively.

The controller 490 may then select $V_{1+}-V_{2+}$ via select signal SEL=1. Initially, the compensation voltage $V_{COMP}$ based on $V_{1+}-V_{2+}$ may not be at 0V, which means the aged replica circuit 440 and the unaged replica circuit 450 are not fully calibrated. The digital encoder 412 generates the code based on the compensation voltage $V_{COMP}$. The control circuit 416 adjusts the current control voltage $V_{CS4}$ to adjust the current generated by the current source 460 until the code indicates that the compensation voltage $V_{COMP}$ is substantially at 0V. After the startup calibration, the control circuits 418 and 416 maintain the current control voltages $V_{CS2}-V_{CS4}$ substantially constant, as the unaged replica circuit 450 may be calibrated once upon startup.

Next, the controller 490 sets the mode signal to aging mode. In response to the aging mode, the tristate buffers 432 and 434 are not tristated, and the switching devices $SW_1$ and $SW_2$ are in the open state. The tristate buffers 432 and 434 passes the differential simulated aging signal $V_{SAS}$ to the gates of the PMOS FETs M1 and M2 of the aged replica circuit 440 when the VCO 420 is enabled by the asserted receiver enable signal $V_{EN\_RX}$. Accordingly, the aged replica circuit 440 gets aged substantially the same or more aggressive as the set of receivers 215-1 to 215-N.

Regarding the unaged replica circuit 450 in aging mode, it is effectively disabled by the multiplexers 454 and 456 passing the disabling voltage $V_{DSB}$ to the gates of PMOS FETs M3 and M4 to turn these devices off. Also, in response to the aging mode, the control circuit 418 may configure the current control voltage $V_{CS2}$ to turn off the variable current source 452. The control circuit 416 may also configure the current control voltages $V_{CS3}$ and $V_{CS4}$ to turn off the variable current sources 458 and 460, respectively. This is done to maintain the unaged replica circuit 450 effectively unaged during aging mode, this mode occupies the majority of time pertaining to operation of the aging compensation circuit 400. Further, in aging mode, the comparator 460 is effectively disabled. The control circuit 414 of the calibration control circuit 410 maintains the current control voltage $V_{CS1}$ for the variable current source 442 of the aged replica circuit 440 and the broadcast aging compensation signal (AGING $CS_B$) substantially constant, and based on the final code determined during the previous calibration cycle.

As discussed, on a periodic or other time-based manner, the controller 490 sets the mode signal to indicate calibration mode. As the unaged replica circuit 440 and the set of receivers 215-1 to 215-N get aged in aging mode, the conductivity of the PMOS FETs M1 and M2 and the corresponding PMOS FETs in the receivers 215-1 to 215-N for the same gate-to-source voltage $V_{GS}$ gets reduced. Accordingly, the differential output voltages $V_{1+}$ and $V_{1-}$ tend to decrease with aging. Thus, in calibration mode, the aging compensation circuit 400 adjusts the differential output voltages $V_{1+}$ and $V_{1-}$ so that they are substantially the same as the differential output voltages $V_{2+}$ and $V_{2-}$ of the unaged replica circuit 450.

Accordingly, in response to the calibration mode, the tristate buffers 432 and 434 are tristated, and the switching devices $SW_1$ and $SW_2$ are in the closed state. The voltage regulator 245 may provide a common mode voltage $V_{CMA}$ to the gates of the PMOS FETs M1 and M2 via the closed switching devices $SW_1$ and $SW_2$, respectively. The voltage regulator 245 may also provide the common mode voltage $V_{CMA}$ to the second inputs of the multiplexers 454 and 456 of the unaged replica circuit 450. The multiplexers 454 and 456, in response to mode signal indicating calibration mode, passes the common mode voltage $V_{CMA}$ to the gates of the PMOS FETs M3 and M4, respectively. Also, in response to the calibration mode, the control circuits 418 and 416 generate the current control voltages $V_{CS2}$-$V_{CS4}$ per the code finalized during the startup mode.

The controller 490 may select $V_{2-}$-$V_{1-}$ via select signal SEL=0 to calibrate the aged replica circuit 440 and the unaged replica circuit 450. Due to aging, the compensation voltage $V_{COMP}$ may no longer be at substantially 0V, which means the aged replica circuit 440 has aged compared to the unaged replica circuit 450. The digital encoder 412 generates the code based on the compensation voltage $V_{COMP}$. The control circuit 414 adjusts the current control voltage $V_{CS1}$ to adjust the current generated by the variable current source 442 until the code indicates that the compensation voltage $V_{COMP}$ is substantially at 0V. The controller 490 may optionally select $V_{1+}$-$V_{2+}$ via select signal SEL=1 to determine whether the calibration of $V_{2-}$-$V_{1-}$ also resulted in $V_{1+}$-$V_{2+}$ being substantially at 0V. It shall be understood that the controller 490 may select $V_{1+}$-$V_{2+}$ via select signal SEL=1 to base its calibration on, and then optionally select $V_{2-}$-$V_{1-}$ via select signal SEL=0 to determine whether the calibration also resulted in $V_{2-}$-$V_{1-}$ being substantially at 0V. The control circuit 414 then broadcasts the aging compensation signal (AGING $CS_B$) for the set of receivers 215-1 to 215-N based on the final code arrived during this calibration cycle. Once the calibration cycle is complete, the controller 490 configures the aging compensation circuit 400 in aging mode.

Figure 5:
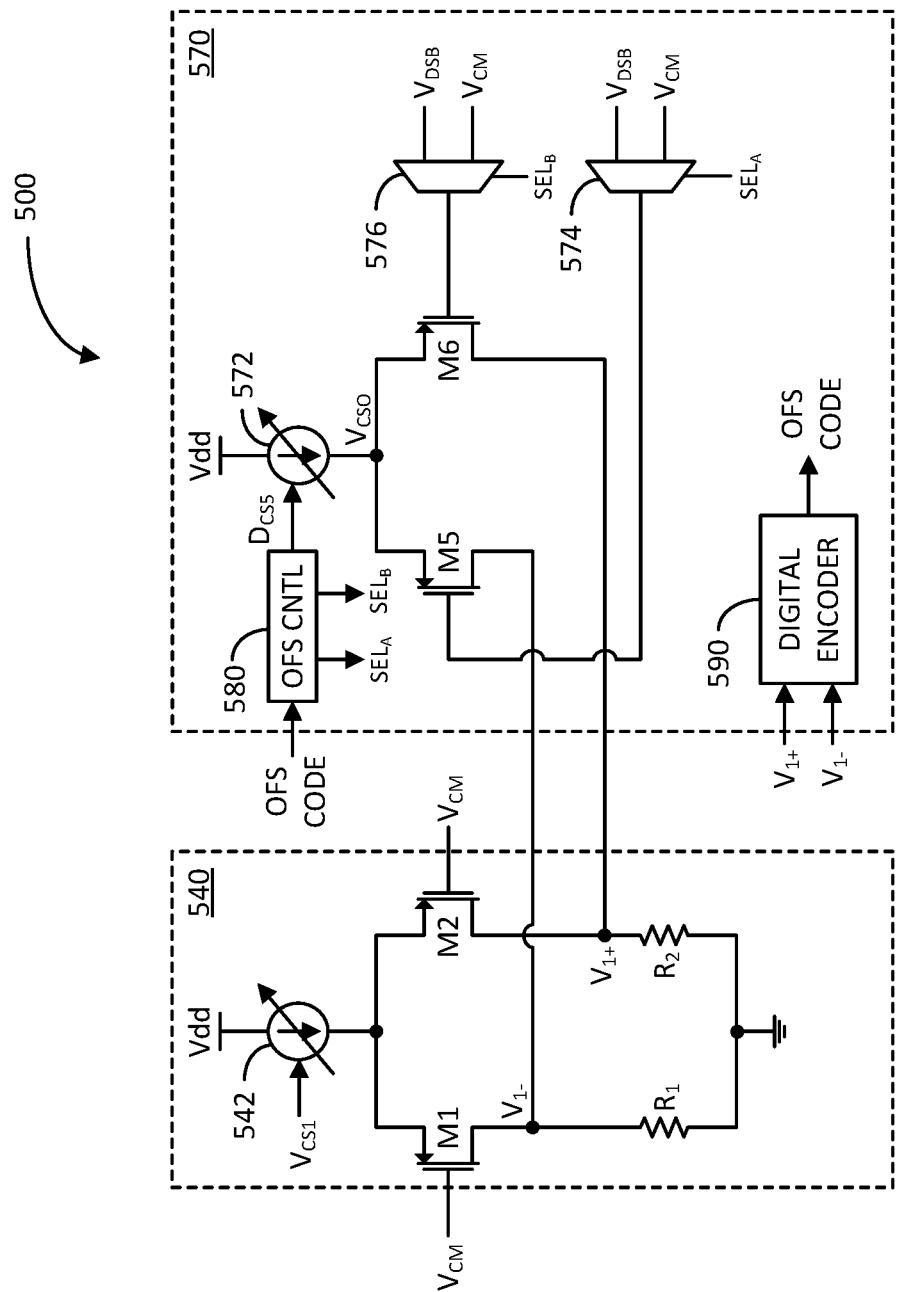
FIG. 5 illustrates a schematic diagram of a portion of an example aging compensation circuit in accordance with another aspect of the disclosure.

FIG. 5 illustrates a schematic diagram of a portion of an example aging compensation circuit 500 in accordance with another aspect of the disclosure. The aging compensation circuit 500 may include an offset voltage cancellation circuit 570 configured to substantially remove any offset between the output voltages $V_{1+}$ and $V_{1-}$ generated by an aged replica circuit 540. The offset voltage cancellation circuit 570 may perform an offset voltage cancellation based on a coarse (lower) resolution compared to the offset voltage cancellation circuit achievable by current sources 458 and 460 of the unaged replica circuit 450 previously discussed. As an example, the coarse offset cancellation circuit 570 may cancel offset voltage between $V_{1+}$ and $V_{1-}$ on the order of 6.5 millivolts (mV); whereas the fine offset voltage cancellation achievable by current sources 458 and 460 of the unaged replica circuit 450 may cancel offset voltages between $V_{2+}$ and $V_{2-}$ on the order of 1.25 mV.

More specifically, the aging compensation circuit 500 includes the aged replica circuit 540 as previously discussed, including the variable current source 542, the input differential PMOS FET pair M1 and M2, and the differential output resistors $R_1$ and $R_2$. For offset calibration, a common mode voltage $V_{CM}$ may be applied to the gates of the differential FET pair M1 and M2.

The coarse offset cancellation circuit 570 includes a variable current source 572, input differential PMOS FET pair M5 and M6, first and second multiplexers 574 and 576, an offset control circuit 580, and a digital encoder 590. On the negative side, the current source 572 and PMOS FET M5 are coupled in series between the upper voltage rail Vdd and the node between the drain of PMOS FET M1 and output resistor $R_1$ (negative output) of the aged replica circuit 540. On the positive side, the current source 572 and PMOS FET M6 are coupled in series between the upper voltage rail Vdd and the node between the drain of PMOS FET M2 and output resistor $R_2$ (positive output) of the aged replica circuit 540.

The first multiplexer 574 includes first and second inputs configured to receive a disabling voltage $V_{DSB}$ (e.g., Vdd or $V_{CSO}$) and a common mode voltage $V_{CM}$, respectively. The first multiplexer 574 includes a select input configured to receive a select signal $SEL_A$ generated by the offset control circuit 580, and an output coupled to the gate of PMOS FET M5. Similarly, the second multiplexer 576 includes first and second inputs configured to receive the disabling voltage $V_{DSB}$ and the common mode voltage $V_{CM}$, respectively, a select input configured to receive a select signal $SEL_B$ generated by the offset control circuit 580, and an output coupled to the gate of PMOS FET M6. Additionally, the offset control circuit 580 is configured to receive an offset code generated by the digital encoder 590, which may be based on a difference between the voltages $V_{1+}$ and $V_{1-}$, and generate a current control signal or code $D_{CS5}$ for the variable current source 572 based on the offset code.

The offset cancellation operates as follows: The offset control circuit 580 receives the offset code from the digital encoder 590 and determines if there is an offset between the voltages $V_{1+}$ and $V_{1-}$. If the offset is positive (meaning that $V_{1+}$>$V_{1-}$) as indicated by the offset code, the offset control circuit 580 sets select signal $SEL_A$ to pass the common mode voltage $V_{CM}$ to turn on PMOS FET M5, and select signal $SEL_B$ to pass the disabling voltage $V_{DSB}$ to turn off PMOS FET M6. The offset control circuit 580 then generates the current control $D_{CS5}$ to increase the current generated by the current source 572 to produce additional current flow through the resistor $R_1$; thereby, increasing $V_{1-}$ until it substantially equals to $V_{1+}$ as indicated by the offset code. If the offset is negative (meaning that $V_{1+}<V_{1-}$) as indicated by the offset code, the offset control circuit 580 sets select signal $SEL_A$ to pass the disabling voltage $V_{DSB}$ to turn off PMOS FET M5, and select signal $SEL_B$ to pass the common mode voltage $V_{CM}$ to turn on PMOS FET M6, respectively. The offset control circuit 580 then generates the current control code $D_{CS5}$ to increase the current generated by the current source 572 to produce additional current flow through the resistor $R_2$; thereby, increasing $V_{1+}$ until it substantially equals to $V_{1-}$ as indicated by the offset code.

Figure 6:
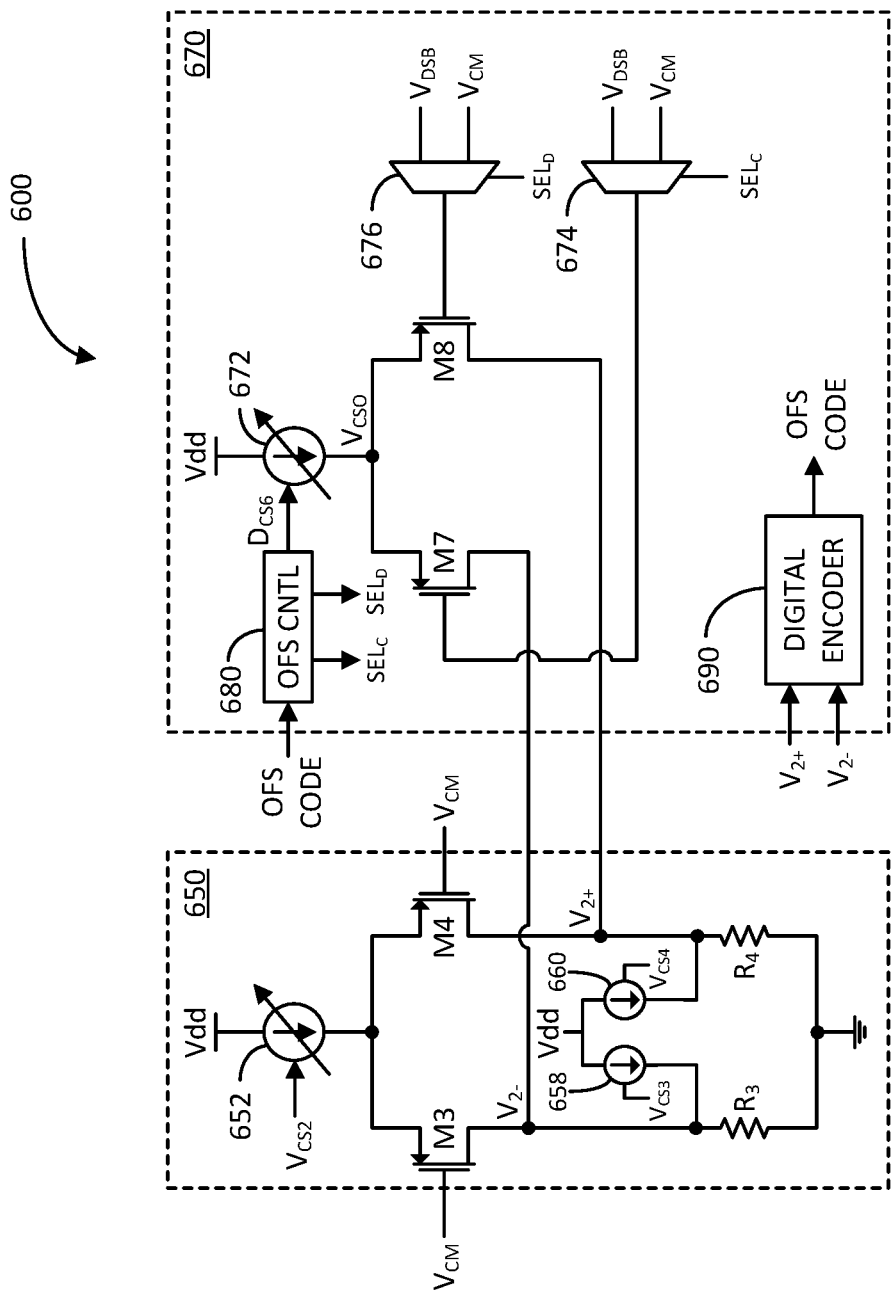
FIG. 6 illustrates a schematic diagram of another portion of an example aging compensation circuit in accordance with another aspect of the disclosure.

FIG. 6 illustrates a schematic diagram of a portion of an example aging compensation circuit 600 in accordance with another aspect of the disclosure. The aging compensation circuit 600 may include an offset voltage cancellation circuit 670 configured to substantially remove any offset between the output voltages $V_{2+}$ and $V_{2-}$ generated by an unaged replica circuit 650. The offset voltage cancellation circuit 670 may perform an offset voltage cancellation based on a coarse (lower) resolution compared to the offset voltage cancellation achievable by current sources 658 and 660 of the unaged replica circuit 650. As an example, the coarse offset cancellation circuit 670 may cancel offset voltage between $V_{2+}$ and $V_{2-}$ on the order of 6.5 millivolts (mV); whereas the fine offset voltage cancellation achievable by the current sources 658 and 660 of the unaged replica circuit 650 may cancel offset voltages between $V_{2+}$ and $V_{2-}$ on the order of 1.25 mV.

More specifically, the aging compensation circuit 600 includes the unaged replica circuit 650 as previously discussed, including the variable current source 652, the input differential PMOS FET pair M3 and M4, the differential output resistors $R_3$ and $R_4$, and the fine offset voltage calibration circuitry including variable current sources 658 and 660. For coarse offset calibration, a common mode voltage $V_{CM}$ may be applied to the gates of the differential FET pair M3 and M4.

The coarse offset cancellation circuit 670 includes a variable current source 672, input differential PMOS FET pair M7 and M8, first and second multiplexers 674 and 676, an offset control circuit 680, and a digital encoder 690. On the negative side, the current source 672 and PMOS FET M7 are coupled in series between the upper voltage rail Vdd and the node between the drain of PMOS FET M3 and output resistor $R_3$ (negative output) of the unaged replica circuit 650. On the positive side, the current source 672 and PMOS FET M8 are coupled in series between the upper voltage rail Vdd and the node between the drain of PMOS FET M4 and the output resistor $R_4$ (positive output) of the unaged replica circuit 650.

The first multiplexer 674 includes first and second inputs configured to receive a disabling voltage $V_{DSB}$ (e.g., Vdd or $V_{CSO}$) and a common mode voltage $V_{CM}$, respectively. The first multiplexer 674 includes a select input configured to receive a select signal $SEL_C$ generated by the offset control circuit 680, and an output coupled to the gate of PMOS FET M7. Similarly, the second multiplexer 676 includes first and second inputs configured to receive the disabling voltage $V_{DSB}$ and the common mode voltage $V_{CM}$, respectively, a select input configured to receive the select signal $SEL_D$ generated by the offset control circuit 680, and an output coupled to the gate of PMOS FET M8. Additionally, the offset control circuit 680 is configured to receive an offset code generated by the digital encoder 690, which may be based on a difference between the voltages $V_{2+}$ and $V_{2-}$, and generate a current control signal or code $D_{CS6}$ for the variable current source 672 based on the offset code.

The offset cancellation operates as follows: The offset control circuit 680 receives the offset code from the digital encoder 690 and determines if there is an offset between the voltages $V_{2+}$ and $V_{2-}$. If the offset is positive (meaning that $V_{2+}>V_{2-}$) as indicated by the offset code, the offset control circuit 680 sets select signal $SEL_C$ to pass the common mode voltage $V_{CM}$ to turn on PMOS FET M7, and select signal $SEL_D$ to pass the disabling voltage $V_{DSB}$ to turn off PMOS FET M8. The offset control circuit 680 then generates the current control code $D_{CS6}$ to increase the current generated by the current source 672 to produce additional current flow through the resistor $R_3$; thereby, increasing $V_{2-}$ until it substantially equals to $V_{2+}$ as indicated by the offset code. If the offset is negative (meaning that $V_{2+}<V_{2-}$) as indicated by the offset code, the offset control circuit 680 sets select signal $SEL_C$ to pass the disabling voltage $V_{DSB}$ to turn off PMOS FET M7, and select signal $SEL_D$ to pass the common mode voltage $V_{CM}$ to turn on PMOS FET M8. The offset control circuit 680 then generates the current control code $D_{CS6}$ to increase the current generated by the current source 672 to produce additional current flow through the resistor $R_4$; thereby, increasing $V_{2+}$ until it substantially equals to $V_{2-}$ as indicated by the offset code.

Figure 7:
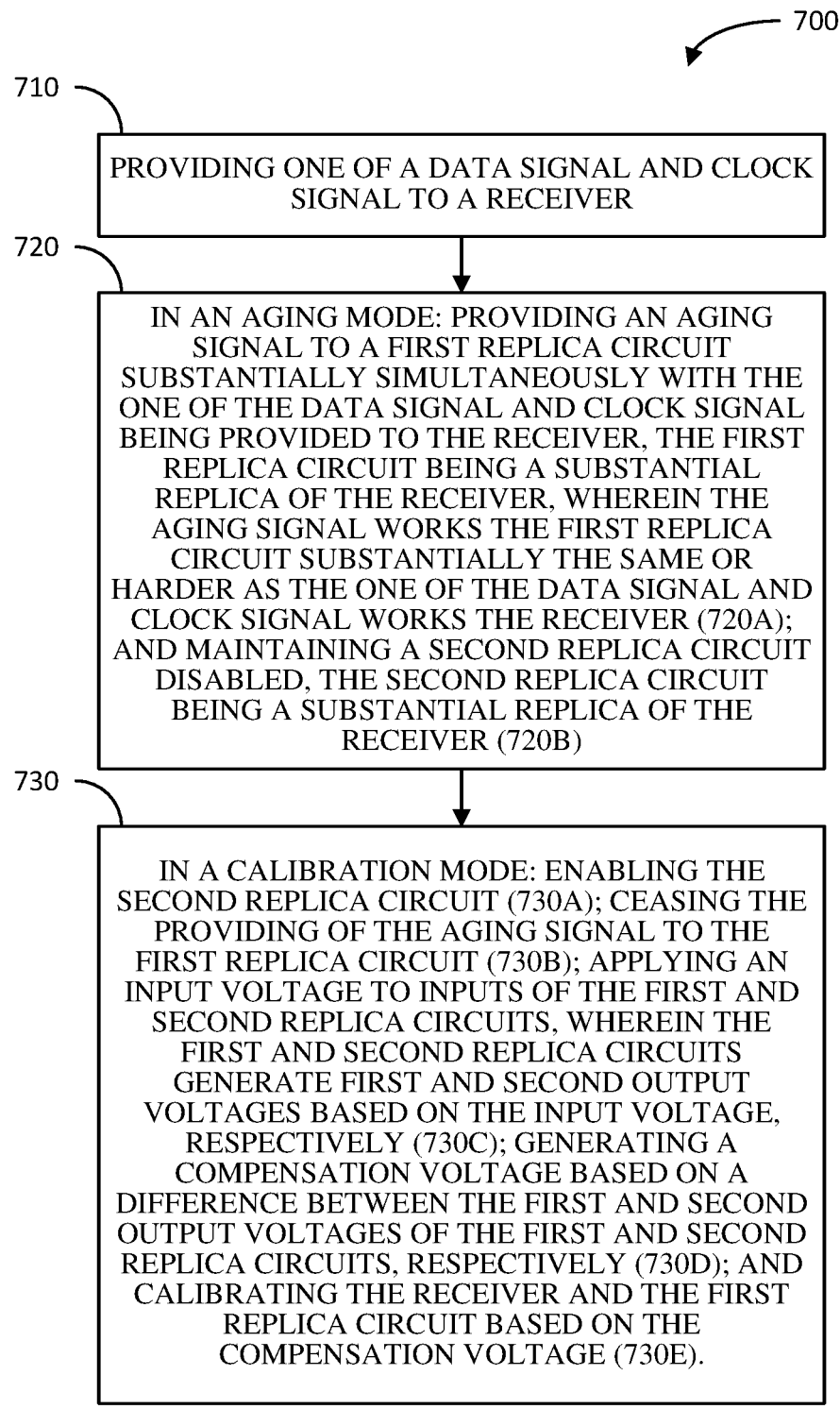
FIG. 7 illustrates a flow diagram of an example method of compensating a receiver for aging effects in accordance with another aspect of the disclosure.

FIG. 7 illustrates a flow diagram of an example method 700 of compensating a receiver for aging effects in accordance with another aspect of the disclosure. The method 700 includes providing one of a data signal and a clock signal to a receiver (block 710). Examples of means for providing one of a data signal and a clock signal to a receiver include any one of the transmitters and transmission mediums described herein.

The method 700 further includes, in an aging mode (block 720): providing an aging signal to a first replica circuit substantially simultaneously with the one of the data signal and clock signal being provided to the receiver, the first replica circuit being a substantial replica of the receiver, wherein the aging signal works the first replica circuit substantially the same or harder as the one of the data signal and clock signal works the receiver (subblock 720A). Examples of means for providing an aging signal to a first replica circuit substantially simultaneously with the one of the data signal and clock signal being provided to the receiver include the aging control circuit 140, the VCO 240, and voltage level shifter or CML 340. Additionally, the method 700 includes maintaining a second replica circuit disabled, the second replica circuit being a substantial replica of the receiver (subblock 720B). Examples of means for maintaining a second replica circuit disabled include any of the voltage generators and the multiplexers applying the disabling voltage $V_{DSB}$ to any of the unaged replica circuits.

The method 700 also includes, in a calibration mode (block 730): enabling the second replica circuit (subblock 730A). Example of means for enabling the second replica circuit include any of the voltage generators and the multiplexers applying a common mode voltage to any of the unaged replica circuits. The method 700 further includes ceasing the providing of the aging signal to the first replica circuit (subblock 730B). Examples of means for ceasing the providing of the aging signal to the first replica circuit include the multiplexers 150, 250, 350, and tristate buffers 432 and 434. Further, the method 700 includes applying an input voltage to inputs of the first and second replica circuits, wherein the first and second replica circuits generate first and second output voltages based on the input voltage, respectively (subblock 730C). Examples of means for applying an input voltage to inputs of the first and second replica circuits include any of the voltage generators and multiplexers routing the common mode voltage $V_{CM}$ to any of the aged and unaged replica circuits, respectively.

Additionally, the method 700 includes generating a compensation voltage based on a difference between the first and second output voltages of the first and second replica circuits, respectively (subblock 730D). Examples of means for generating a compensation voltage based on a difference between the first and second output voltages of the first and second replica circuits, respectively, include any of the comparators described herein. The method 700 also includes calibrating the receiver and the first replica circuit based on the compensation voltage (subblock 730E). Examples of means for calibrating the receiver and the first replica circuit based on the compensation voltage include any of the calibrating control circuits described herein.

The method 700 may further include, in a startup mode, applying the input voltage to the inputs of the first and second replica circuits, wherein the first and second replica circuits generates third and fourth output voltages based on the input voltage, respectively. Examples of means for applying the input voltage to the first and second replica circuits include any of the voltage generators and the multiplexers applying a common mode voltage to any of the unaged replica circuits. The method 700 may additionally include applying a current to the second replica circuit to adjust the difference between the first and second output voltages. Examples of means for applying a current to the second replica circuit to adjust the difference between the first and second output voltages include the fine offset cancellation current sources. Further, the method 700 may include calibrating at least one other receiver based on the difference between the first and second output voltages. Examples of means for calibrating at least one other receiver based on the difference between the first and second output voltages include any of the calibrating control circuits described herein.

Figure 8:
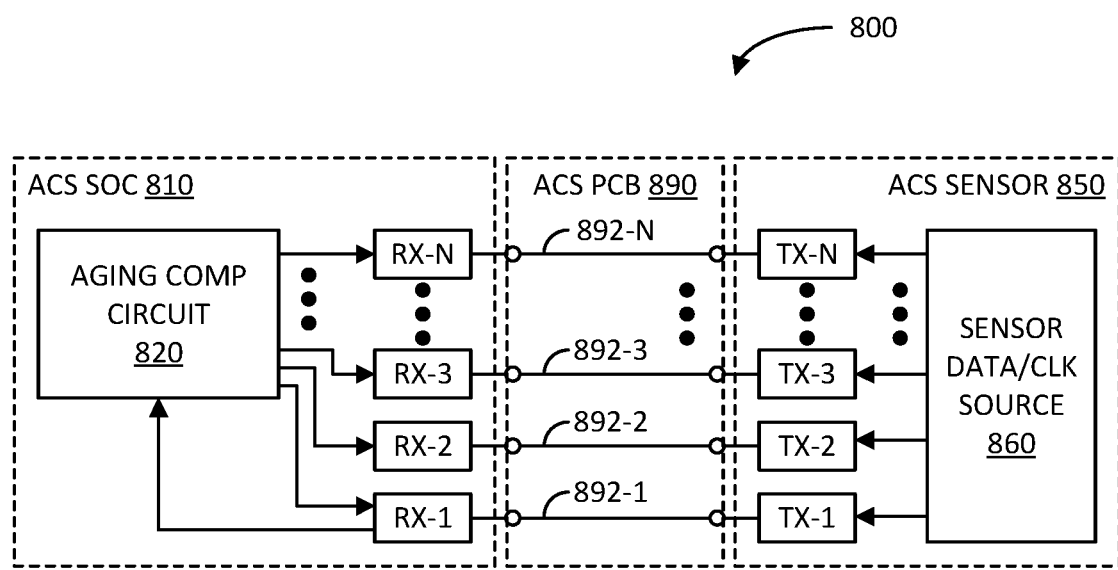
FIG. 8 illustrates a block diagram of an example automotive control system in accordance with another aspect of the disclosure.

FIG. 8 illustrates a block diagram of an example automotive control system 800 in accordance with another aspect of the disclosure. The automotive control system 800 includes an automatic control system (ACS) integrated circuit (IC) 810, such as a system on chip (SOC). The ACS SOC 810 includes a set of receivers RX-1 to RX-N and an aging compensation circuit 820. The aging compensation circuit 820 may be implemented per any of the aging compensation circuits described herein. In this example, the aging compensation circuit 820 is coupled to receiver RX-1, such as to receive the receiver enable signal $V_{EN\_RX}$ as per aging compensation circuit 230, or a data or clock signal from an intermediate node or output of the receiver RX-1 as per aging compensation circuit 330. The aging compensation circuit 820 is also coupled to the set of receivers RX-1 to RX-N to provide them the broadcast aging control signal (AGING $CS_B$) as previously discussed.

The automotive control system 800 further includes an ACS sensor 850 including a sensor data and clock source 860 and a set of transmitters TX-1 to TX-N. The sensor data and data clock source 860 is coupled to the set of transmitters TX-1 to TX-N to provide a set of data signals and clock to the set of transmitters TX-1 to TX-N. The data signals may pertain to different automotive parameters that the ACS sensor 850 is configured to sense (e.g., engine parameters, autonomous/assisted driving parameters, passenger comfort/entertainment parameters, etc.). The set of transmitters TX-1 to TX-N is coupled to the set of receivers RX-1 to RX-N via a set of transmission metallization lines 892-1 to 892-N formed on a printed circuit board (PCB) 890. The data/clock signals are communicated from the set of transmitters TX-1 to TX-N to the set of receivers RX-1 to RX-N via the set of transmission lines 892-1 to 892-N, respectively. Although not shown, the ACS SOC 810 may include one or more data signal processing cores to process the data signals from the ACS sensor 850 in accordance with a particular automatic control application.

The following provides an overview of aspects of the present disclosure:

Aspect 1: An apparatus, including: a set of one or more receivers; a first replica circuit being a substantial replica of at least a portion of one of the set of one or more receivers; a first control circuit generates an output signal selectively coupled to an input of the first replica circuit; a second replica circuit being a substantial replica of at least a portion of one of the set of one or more receivers; a comparator including a first input coupled to a first output of the first replica circuit, a second input coupled to a second output of the second replica circuit, and an output; and a second control circuit including an input coupled to the output of the comparator, and an output coupled to the first replica circuit and to the set of one or more receivers.

Aspect 2: The apparatus of aspect 1, wherein the first control circuit includes an oscillator.

Aspect 3: The apparatus of aspect 1 or 2, further including an enable signal coupled to the set of one or more receivers and to the first control circuit.

Aspect 4: The apparatus of any one of aspects 1-3, further including a voltage generator including an output coupled to the input of the first replica circuit.

Aspect 5: The apparatus of aspect 4, further including a multiplexer including a first input coupled to the output of the first control circuit, a second input coupled to the output of the voltage generator, and an output coupled to the input of the first replica circuit.

Aspect 6: The apparatus of any one of aspects 1-5, wherein the first control circuit includes an input coupled to an output of one of the set of one or more receivers.

Aspect 7: The apparatus of aspect 6, wherein the first control circuit includes one of a voltage level shifter and current-mode logic (CML) circuit.

Aspect 8: The apparatus of aspect 7, further including a voltage generator including an output selectively coupled to the input of the first replica circuit.

Aspect 9: The apparatus of aspect 8, further including a multiplexer including a first input coupled to an output of the one of the voltage level shifter and CML circuit, a second input coupled to the output of the voltage generator, and an output coupled to the input of the first replica circuit.

Aspect 10: The apparatus of any one of aspects 1-9, further including: a voltage generator including an output selectively coupled to an input of the second replica circuit; and a receiver disabling signal selectively coupled to the input of the second replica circuit.

Aspect 11: The apparatus of aspect 10, further including a multiplexer including a first input coupled to the output of the voltage generator, a second input coupled to the output of the receiver disabling signal, and an output coupled to the input of the second replica circuit.

Aspect 12: The apparatus of any one of aspects 1-11, wherein: the first replica circuit includes a first current source, a first field effect transistor (FET), and a first resistor coupled in series between a first voltage rail and a second voltage rail; and the second replica circuit includes a second current source, a second FET, and a second resistor coupled in series between the first voltage rail and the second voltage rail.

Aspect 13: The apparatus of aspect 12, wherein the output of the second control circuit is coupled to the first and second current sources of the first and second replica circuits, respectively.

Aspect 14: The apparatus of aspect 13, wherein the second control circuit includes: a digital encoder; and a first controller including an input coupled to an output of the digital encoder, a first output coupled to the first current source of the first replica circuit, and a second output coupled to a set of one or more corresponding current sources of the set of one or more receivers, respectively.

Aspect 15: The apparatus of aspect 14, wherein the second control circuit further includes a second controller including an input selectively coupled to the first output of the first controller, and an output coupled to the second current source of the second replica circuit.

Aspect 16: The apparatus of any one of aspects 12-15, further including a receiver disabling signal coupled to the second current source and the second FET of the second replica circuit.

Aspect 17: The apparatus of any one of aspects 12-16, wherein the second replica circuit includes a third current source coupled between the first voltage rail and the second resistor.

Aspect 18: The apparatus of any one of aspects 12-17, further including: a first offset cancellation circuit coupled to a first node between the first FET and the first resistor of the first replica circuit; and a second offset cancellation circuit coupled to a second node between the second FET and the second resistor of the second replica circuit.

Aspect 19: The apparatus of aspect 18, further including a voltage generator coupled to the first and second offset cancellation circuits.

Aspect 20: The apparatus of any one of aspects 1-19, wherein: the first replica circuit includes a first current source, a first differential pair of field effect transistors (FETs), and a first pair of resistors coupled in series between a first voltage rail and a second voltage rail, respectively; the second replica circuit includes a second current source, a second differential pair of FETs, and a second pair of resistors coupled in series between the first voltage rail and the second voltage rail, respectively; and the comparator includes: a first multiplexer including first and second inputs coupled to one of the first and second pairs of resistors, respectively; a second multiplexer including first and second inputs coupled to the other one of the first and second pairs of resistors, respectively; and a differential amplifier including inputs coupled to outputs of the first and second multiplexers, respectively.

Aspect 21: A method, including: providing one of a data signal and clock signal to a receiver; in an aging mode: providing an aging signal to a first replica circuit substantially simultaneously with the one of the data signal and a clock signal being provided to the receiver, the first replica circuit being a substantial replica of the receiver, wherein the aging signal works the first replica circuit substantially the same or harder as the one of the data signal and clock signal works the receiver, and maintaining a second replica circuit disabled, the second replica circuit being a substantial replica of the receiver; in a calibration mode: enabling the second replica circuit; ceasing the providing of the aging signal to the first replica circuit; applying an input voltage to inputs of the first and second replica circuits, wherein the first and second replica circuits generate first and second output voltages based on the input voltage, respectively; generating a compensation voltage based on a difference between the first and second output voltages of the first and second replica circuits, respectively; and calibrating the receiver and the first replica circuit based on the difference between the first and second output voltages.

Aspect 22: The method of aspect 21, wherein the aging signal includes an oscillating signal with a frequency within a range or higher than one of a data rate of the data signal and frequency of the clock signal.

Aspect 23: The method of aspect 21 or 22, wherein the aging signal is based on one of the data signal and clock signal.

Aspect 24: An apparatus, including: means for providing one of a data signal and clock signal to a receiver; in an aging mode: means for providing an aging signal to a first replica circuit substantially simultaneously with the one of the data signal and clock signal being provided to the receiver, the first replica circuit being a substantial replica of the receiver, wherein the aging signal works the first replica circuit substantially the same or harder as the one of the data signal and clock signal works the receiver, and means for maintaining a second replica circuit disabled, the second replica circuit being a substantial replica of the receiver; in a calibration mode: means for enabling the second replica circuit; means for ceasing the providing of the aging signal to the first replica circuit; means for applying an input voltage to inputs of the first and second replica circuits, wherein the first and second replica circuits generate first and second output voltages based on the input voltage, respectively; means for generating a compensation voltage based on a difference between the first and second output voltages of the first and second replica circuits, respectively; and means for calibrating the receiver and the first replica circuit based on the difference between the first and second output voltages.

Aspect 25: The apparatus of aspect 24, wherein the aging signal includes an oscillating signal with a frequency within a range or higher than one of a data rate of the data signal and frequency of the clock signal.

Aspect 26: The apparatus of aspect 24 or 25, wherein the aging signal is based on one of the data signal and clock signal.

Aspect 27: An automotive control system, including: a set of automotive control signal transmitters; a set of automotive control signal receivers coupled to the set of automotive control signal transmitters via a set of transmission lines, respectively; and an aging compensation circuit, including: a first replica circuit being a substantial replica of one of the set of automotive control signal receivers; a first control circuit including an output selectively coupled to an input of the first replica circuit; a second replica circuit being a substantial replica of one of the set of automotive control signal receivers; a comparator including a first input coupled to a first output of the first replica circuit, and a second input coupled to a second output of the second replica circuit; and a second control circuit including an input coupled to an output of the comparator, and an output coupled to the first replica circuit and to the set of automotive control signal receivers.

Aspect 28: The automotive control system of aspect 27, wherein the first control circuit includes an oscillator.

Aspect 29: The automotive control system of aspect 27 or 28, wherein the first control circuit includes an input coupled to an output of one of the set of one or more receivers.

Aspect 30: The automotive control system of any one of aspects 27-29, wherein the set of automotive control signal transmitters and the set of automotive control signal receivers are part of a low power double data rate (LPDDR) interface.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   a target circuit;
   a first replica of the target circuit configured to generate a first signal;
   a second replica of the target circuit configured to generate a second signal;
   a first control circuit configured to operate the first replica target circuit substantially the same or harder than the target circuit; and
   a second control circuit configured to adjust the target circuit and the first replica target circuit based on the first and second signals.

2. The apparatus of claim 1, wherein the target circuit is configured to process a digital signal at a data rate, and wherein the first control circuit is configured to generate an aging signal to operate the first replica target circuit at a rate substantially the same or higher than the data rate at which the target circuit processes the digital signal.

3. The apparatus of claim 2, wherein the first control circuit comprises an oscillator configured to generate the aging signal.

4. The apparatus of claim 3, wherein the oscillator is configured to generate the aging signal in response to the target circuit processing the data signal.

5. The apparatus of claim 2, wherein the first control circuit is configured to generate the aging signal based on the digital signal.

6. The apparatus of claim 5, wherein the first control circuit is configured to voltage level shift the digital signal to generate the aging signal.

7. The apparatus of claim 1, further comprising a comparator configured to generate a compensation signal based on a difference between the first and second signals, wherein second control circuit is configured to adjust the target circuit and the first replica target circuit based on the compensation signal.

8. The apparatus of claim 1, wherein the first control circuit is configured to operate the first replica target circuit in an aging mode of operation, and wherein the second replica target circuit is disabled during the aging mode of operation.

9. The apparatus of claim 1, wherein the second control circuit is configured to adjust the target circuit and the first replica target circuit during a calibration mode of operation.

10. The apparatus of claim 9, wherein the first control circuit is decoupled from the first replica target circuit during the calibration mode of operation.

11. The apparatus of claim 9, further comprising a voltage generator configured to generate an input signal, wherein the first and second replica target circuits are configured to generate the first and second signals based on the input signal during the calibration mode of operation.

12. The apparatus of claim 9, wherein the second control circuit is configured to adjust the target circuit and the first replica target circuit such that the first signal is substantially the same as the second signal.

13. The apparatus of claim 9, wherein the first replica target circuit comprises a current source, wherein the second control circuit is configured to adjust the first replica target circuit including adjusting a current generated by the current source during the calibration mode of operation, and wherein the first signal is based on the current.

14. The apparatus of claim 1, wherein the second control circuit is configured to adjust the first replica target circuit and the second replica target circuit during a startup mode of operation.

15. The apparatus of claim 14, wherein the second control circuit is not configured to adjust the target circuit during the startup mode of operation.

16. The apparatus of claim 14, wherein the first replica target circuit comprises a first current source, wherein the second replica target circuit comprises a second current source, wherein the second control circuit is configured to adjust at least one of the first and second current sources such that the first and second currents cause the first signal to be substantially the same as the second signal during the startup mode of operation.

17. An apparatus, comprising:
    a receiver configured to process a data signal;
    a first replica of the receiver configured to generate a first signal during a calibration mode of operation;
    a second replica of the receiver configured to generate a second signal during the calibration mode of operation;
    a first control circuit configured to provide an aging signal to the first replica receiver to operate the first replica receiver substantially the same or harder than the target circuit in an aging mode of operation; and
    a second control circuit configured to adjust the receiver and the first replica receiver based on the first and second signals during the calibration mode of operation.

18. The apparatus of claim 17, wherein the first control circuit does not provide the aging signal to the first replica receiver during the calibration mode of operation.

19. The apparatus of claim 17, wherein the second replica receiver is disabled during the aging mode of operation.

20. The apparatus of claim 18, wherein the first replica receiver is configured to generate a third signal during a startup mode of operation, wherein the second replica receiver is configured to generate a fourth signal during the startup mode of operation, and wherein the second control circuit is configured to adjust at least one of the first replica receiver or the second replica receiver based on the third and fourth signals during the startup mode of operation.

* * * * *